United States Patent [19]

Hatayama et al.

[11] Patent Number: 4,470,131
[45] Date of Patent: Sep. 4, 1984

[54] BUBBLE MEMORY DEVICE AND METHOD OF MANUFACTURING THE SAME

[75] Inventors: Shigeharu Hatayama; Hirofumi Ota, both of Mobara, Japan

[73] Assignee: Hitachi, Ltd., Tokyo, Japan

[21] Appl. No.: 402,738

[22] Filed: Jul. 28, 1982

[30] Foreign Application Priority Data

Aug. 7, 1981 [JP] Japan .................................. 56-123004

[51] Int. Cl.³ ............................................. G11C 19/08
[52] U.S. Cl. .......................................... 365/2; 29/607
[58] Field of Search ............................... 365/2; 29/607

[56] References Cited

U.S. PATENT DOCUMENTS 4,150,440 4/1979 Bonnie et al. ............................ 365/2
4,164,790 8/1979 Michaelis .................................. 365/2

OTHER PUBLICATIONS

Western Electric Technical Digest-No. 62, Apr. 1981, pp. 11 and 12.
Electronics-Aug. 2, 1979; pp. 99–108.

Primary Examiner—James W. Moffitt
Attorney, Agent, or Firm—Charles E. Pfund

[57] ABSTRACT

A bubble memory device comprises an insulating substrate holding a bubble memory chip secured thereto, X- and Y-direction driving coils wound on the insulating substrate for providing an in-plane rotating filed to the chip, a lead frame secured to edge portions of the insulating substrate, and magnet blocks disposed above and below the coils and including permanent magnets and field homogenizer plates for providing a bias field to the chip. The magnet blocks are molded together with the insulating substrate, coils and lead frame.

2 Claims, 5 Drawing Figures

4,470,131

BUBBLE MEMORY DEVICE AND METHOD OF MANUFACTURING THE SAME

BACKGROUND OF THE INVENTION

This invention relates to a bubble memory device and a method of manufacturing the same.

A prior art bubble memory device has a construction as shown in FIGS. 1 and 2. A ceramic or the like insulating substrate 1 has a central recess formed in the top surface, in which a bubble memory chip 2 is held in a fixed position. Outside the insulating substrate 1, X- and Y-direction driving coils 3a and 3b are wound in perpendicular X- and Y-directions to provide an in-plane rotating magnetic field to the chip 2. The insulating substrate 1, chip 2 and coils 3a and 3b are molded together as a molded assembly 4. The molded assembly 4 has central recesses 4a and 4b formed in the top and bottom surfaces in which are provided magnet blocks 7a and 7b. Each of the central recesses has a central deep portion of a depth D of about 0.4 mm, leaving corner shoulders on which the magnet block rests. The magnet blocks 7a and 7b respectively include plate-like permanent magnets 5a and 5b, which provide a bias field to the chip 2, and field homogenizer plates 6a and 6b for homogenizing the magnetic flux from the permanent magnets 5a and 5b'. The permanent magnets 5a and 5b are covered by a shield case 8 made of Permalloy.

In the bubble memory device as described above, the molded assembly 4 and magents blocks 7a and 7b are usually assembled together in a manner, which will now be described with reference to FIGS. 1 and 2. First, an adhesive is applied to the bottom surfaces of the central deep portions of the recesses 4a and 4b. The magnet blocks 7a and 7b are then set in the recesses to rest on the corner shoulders and bonded by the adhesive. This method of assembling, however, requires a great deal of time for such operations as applying the adhesive, setting the magnet blocks 7a and 7b for bonding and hardening the adhesive. Besides, it is necessary to form the magnet block accommodation recess 4a or 4b having the central deep portion of about 0.4 mm depth. The deep portion is necessary because the recess bottom tends to swell at the time of molding and in the absence of the deep portion, the magnet block would inevitably abut on a swollen area and become inclined to disturb parallelism of the two magnet blocks. Thus, the adhesive is applied to the deep portion and the magnet block resting on the shoulder is bonded to the mold assembly 4 by the adhesive. With this construction, however, moisture is liable to reach the interior coils via a gap between the magnetic block and the shoulder, adhesive and pin holes formed in the mold. Further, the deep portion of about 0.4 mm depth calls for the shoulder of a corresponding height and the device thickness is disadvantageously increased by 0.4×2=0.8 (mm). Further, it is general practice that the plenum between the deep portion bottom and the interior coil layer is made comparatively thick to suppress the generation of swelling, thus aggravating the increase in the device thickness.

SUMMARY OF THE INVENTION

An object of the present invention is to provide a method of manufacturing a bubble memory device capable of simplifying the manufacture process.

Another object of the invention is to provide a bubble memory device which can be reduced in thickness, freed from mold swelling and is highly moisture proof.

According to one aspect of the invention, there is provided a bubble memory device comprising an insulating substrate holding a bubble memory chip secured thereto, X- and Y-direction driving coils wound on said insulating substrate for providing an in-plane rotating filed to said chip, a lead frame secured to edge portions of said insulating substrate, magnet blocks disposed above and below said coils and including permanent magnets and field homogenizer plates for providing a bias field to said chip, and means for fixing said magnet blocks integrally with said insulating substrate, coils and lead frame.

According to another aspect of the invention, there is provided, in a method of manufacturing a bubble memory device comprising the steps of winding X- and Y-direction driving coils for providing a horizontal rotating field to a bubble memory chip on an insulating substrate, on which said chip is securedly supported, securing a lead frame to edge portions of said insulating substrate, and disposing, above and below said coils, magnet blocks including permanent magnets and field homogenizer plates for providing a bias field to said chip, the improvement which comprises pre-magnetizing said magnet blocks, setting the magnetized magnet blocks in a mold such that they are secured to the mold by their own magnetic force and properly positioned in the mold by positioning pins provided in the mold, and pouring a molding resin into said mold together said insulating substrate, coils and lead frame.

DESCRIPTION OF PREFERRED EMBODIMENT

Now, an embodiment of the invention will be described with reference to FIGS. 3 to 5.

Figure 3:
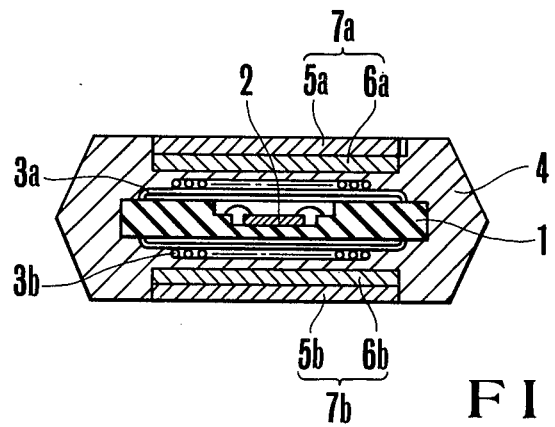
FIG. 3 is a sectional view showing an embodiment of a bubble memory device according to the invention.
Figure 4:
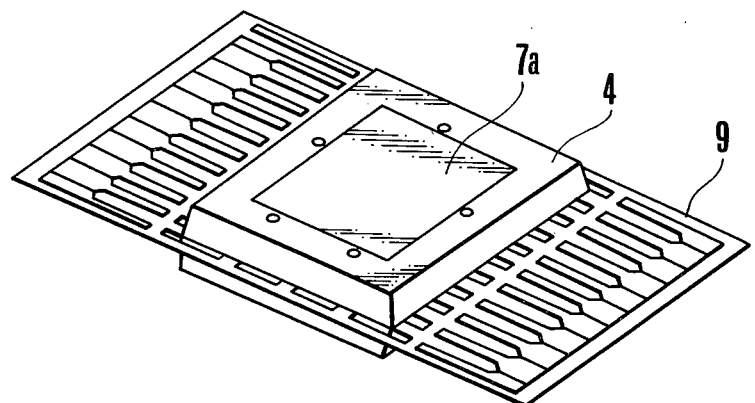
FIG. 4 is a perspective view showing the same.
Figure 5:
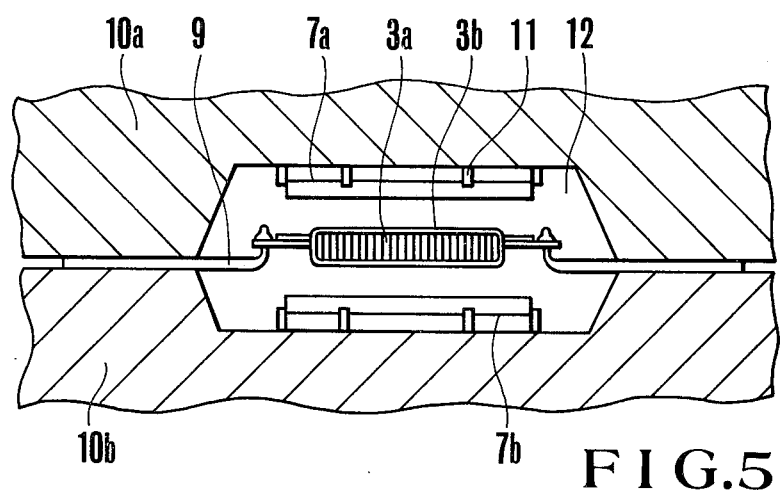
FIG. 5 is a sectional view showing a mold used for manufacturing the same.

FIG. 3 is a sectional view showing a bubble memory device obtained after molding according to the invention, FIG. 4 is a perspective view of the molded assembly in the same embodiment, and FIG. 5 is a sectional view showing a mold ready to pour molding resin.

The construction of the bubble memory device according to the invention, which is shown in FIGS. 3 and 4, features that it is constructed by first assembling together an insulating substrate 1 with coils 3a and 3b wound thereon and a lead frame 9 for electrically connecting a chip 2 to external circuitry and then molding the assembly together with magnet blocks 7a and 7b with a molding resin.

Figure 1:
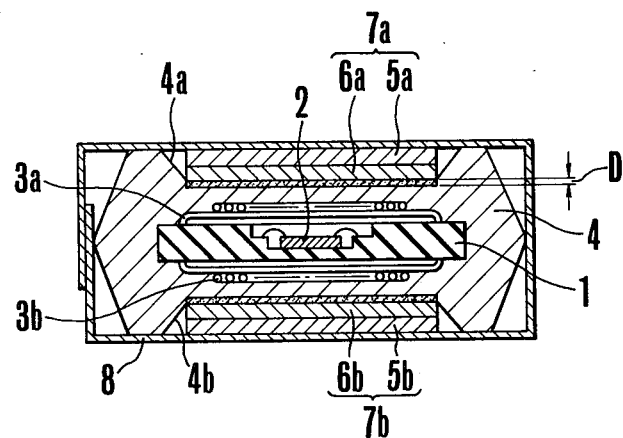
FIG. 1 is a sectional view showing a prior art bubble memory device.
Figure 2:
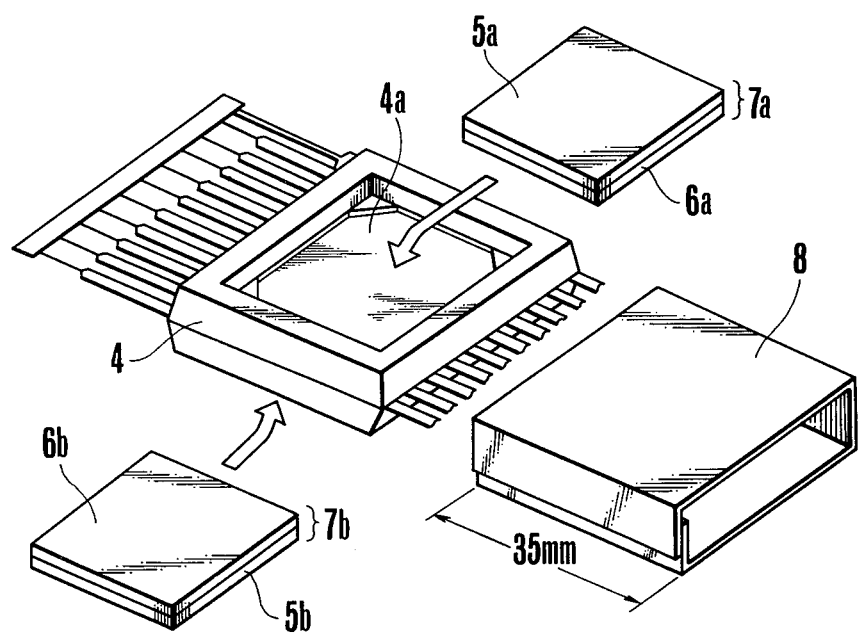
FIG. 2 is an exploded perspective view showing the same.

In the thus constructed bubble memory device, the magnet blocks are fixed integrally with the insulating substrate, coils and lead frame by the molding resin. The magnet block fixed by molding not only blocks any pin holes formed in the mold together with elimination of any passage through which moisture comes into the interior structure within the resin, thus promoting moisture proof ability, but also applies external force to cope with the swelling at the time of molding. Because of the prevention of swelling, the plenum between the magnet block and the coil layer can be reduced in thickness, thus provided for elimination of the corner shoulders, as needed in the prior art device, to contribute to reduction of the device thickness. Further, the temperature difference between the magnet and the chip can be decreased because the thickness of the mold assembly is reduced and the space (corresponding to the depth D in the prior art device as shown in FIG. 1) is eliminated.

The method of assembling the bubble memory device will now be described with reference to FIG. 5. First, the lead frame 9 is set between upper and lower halves 10a and 10b of the mold, and the magnet blocks 7a and 7b are set on the inner wall of the upper and lower mold halves 10a and 10b and properly positioned by positioning pins 11 provided in these mold halves. The magnet blocks are magnetized in advance so that they are secured to the inner walls of the mold by their own magnetic force; the magnet block 7a will not fall but will be secured to the upper mold half 10a by the magnetic force. A molding resin is then poured into a cavity 12 which is defined by the upper and lower mold cast halves 10a and 10b. After the molding resin has been solidified, the mold cast is separated to obtain the completed bubble memory device, in which the lead frame and magnet blocks are molded.

As has been described in the foregoing, with the bubble memory device and method of manufacturing the same according to the invention, the magnet blocks are assembled simultaneously with the molding of the X- and Y-direction driving coils, insulating substrate and lead frame. Thus, there is no need of assembling magnet blocks after the molding as has been done as in the prior art. Also, no long adhesive hardening time is necessary. Further, there is no need of forming any magnet block accommodation recesses in the molding so that there is no possibility of forming any defective molding.

What is claimed is:

1. A bubble memory device comprising an insulating substrate holding a bubble memory chip secured thereto, X- and Y-direction driving coils wound on said insulating substrate for providing an in-plane rotating filed to said chip, a lead frame secured to edge portions of said insulating substrate, magnet blocks disposed above and below said coils and including permanent magnets and field homogenizer plates for providing a bias field to said chip, said magnet blocks being initially held only by their own magnetic force and finally embedded in a molding resin surrounding said insulating substrate, coils and lead frame integrally and immovably secured by said resin without any other structure than said resin.

2. In a method of manufacturing a bubble memory device comprising the steps of winding X- and Y-direction driving coils for providing an in-plane rotating field to a bubble memory chip on an insulating substrate, on which said chip is securedly supported, securing a lead frame to edge portions of said insulating substrate, and disposing magnet blocks including permanent magnets and field homogenizer plates above and below said coils, for providing a bias field to said chip the improvement which comprises pre-magnetizing said magnet blocks, setting the magnetized magnet blocks in a mold such that they are secured to the mold by their own magnetic force and properly positioned in the mold by positioning pins provided in the mold whereby space for receiving resin is formed between said coil and the major surface of said magnet blocks, and pouring a molding resin into said mold to mold together said insulating substrate coils, magnet blocks and lead frame.

* * * * *